United States Patent
Goker et al.

(10) Patent No.: US 9,501,353 B2
(45) Date of Patent: Nov. 22, 2016

(54) ERASURE CODE PRIORITIZATION

(71) Applicant: Quantum Corporation, San Jose, CA (US)

(72) Inventors: Turguy Goker, Irvine, CA (US); Don Doerner, San Jose, CA (US)

(73) Assignee: Quantum Corporation, San Jose, CA (US)

( * ) Notice: Subject to any disclaimer, the term of this patent is extended or adjusted under 35 U.S.C. 154(b) by 21 days.

(21) Appl. No.: 14/607,622

(22) Filed: Jan. 28, 2015

(65) Prior Publication Data

US 2016/0218742 A1   Jul. 28, 2016

(51) Int. Cl.
| | |
|---|---|
| G06F 11/10 | (2006.01) |
| H04L 1/00 | (2006.01) |
| H03M 13/15 | (2006.01) |
| H03M 13/35 | (2006.01) |
| H03M 13/00 | (2006.01) |

(52) U.S. Cl.
CPC ....... G06F 11/1044 (2013.01); G06F 11/1048 (2013.01); G06F 11/1076 (2013.01); H03M 13/154 (2013.01); H03M 13/353 (2013.01); H03M 13/616 (2013.01); H04L 1/007 (2013.01); H04L 1/0009 (2013.01)

(58) Field of Classification Search
CPC .......... G06F 11/1044; G06F 11/1048; H03M 13/353; H04L 1/0009; H04L 1/007
See application file for complete search history.

(56) References Cited

U.S. PATENT DOCUMENTS

| | | | | |
|---|---|---|---|---|
| 4,785,393 | A * | 11/1988 | Chu | G06F 7/57 708/231 |
| 6,275,495 | B1 * | 8/2001 | Mazzaglia | H04L 1/0083 370/395.5 |
| 2005/0257122 | A1 * | 11/2005 | Litwin, Jr. | H03M 13/35 714/774 |
| 2006/0002484 | A1 * | 1/2006 | Miyazaki | H04L 1/1845 375/259 |
| 2008/0282135 | A1 * | 11/2008 | Santou | G06F 7/74 714/801 |
| 2009/0103635 | A1 * | 4/2009 | Pahalawatta | H04L 1/007 375/240.27 |
| 2010/0259596 | A1 * | 10/2010 | Park | H04N 19/00769 348/43 |
| 2012/0011413 | A1 * | 1/2012 | Liu | H04L 1/0009 714/746 |
| 2012/0147140 | A1 * | 6/2012 | Itakura | H04L 1/0041 348/43 |
| 2012/0272116 | A1 * | 10/2012 | Chen | H03M 13/353 714/752 |

* cited by examiner

*Primary Examiner* — Joseph D Torres
(74) *Attorney, Agent, or Firm* — Eschweiler & Associates, LLC

(57) ABSTRACT

Example apparatus and methods selectively generate and store erasure codes differently based on priorities associated with the erasure codes or based on conditions in a data storage system (DSS) that protects messages using erasure codes. Producing a systematic erasure code (EC) may be prioritized over producing a non-systematic EC. Producing an EC associated with correcting X erasures may be prioritized over producing an EC associated with correcting Y erasures, X and Y being numbers, X<Y. The priorities may depend on conditions in the DSS including an erasure code A/B policy, numbers of errors experienced by the DSS, types of errors experienced by the DSS, frequency of errors, an amount of power required to store or retrieve an EC in the DSS, or a network bandwidth required to store or retrieve an EC in the DSS. The priorities may be user configurable or self-adapting.

11 Claims, 10 Drawing Sheets

|   |   |   |   |   |
|---|---|---|---|---|
| 1 | 0 | 0 | ... | 0 |
| 0 | 1 | 0 | ... | 0 |
| 0 | 0 | 1 | ... | 0 |
| ... | ... | ... | ... | ... |
| 0 | 0 | 0 | ... | 1 |
| $\alpha_1$ | $\alpha_2$ | $\alpha_3$ | ... | $\alpha_n$ |
| $\beta_1$ | $\beta_2$ | $\beta_3$ |  | $\beta_n$ |
| ... | ... | ... | ... | ... |
| $\gamma_1$ | $\gamma_2$ | $\gamma_3$ | ... | $\gamma_n$ |

Figure 4

ERASURE CODE PRIORITIZATION

BACKGROUND

Data that is stored or transmitted may be protected against storage media failures or other loss by storing extra copies, by storing additional redundant information, or in other ways. One type of redundancy based protection involves using erasure coding. Erasure coding uses additional redundant data to produce erasure codes that protect against 'erasures'. An erasure code (EC) allows data portions that are lost to be reconstructed from the surviving data. The application of erasure codes to data storage may typically have been for the purpose of recovering data in the face of failures of hardware elements storing the data. Some erasure codes may be simple to compute (e.g., systematic data) while other erasure codes may be more complex to compute (e.g., non-systematic data). Similarly, it may be simpler to recover data using some type of erasure codes (e.g., systematic data) and it may be more complex to recover data using other types of erasure codes (e.g., non-systematic data). However, conventional systems may store erasure codes without considering the complexity and thus the efficiency of recovering data based on the type of erasure code. For example, conventional systems that store data and ECs on disk use sequential disk writes that do not consider the type of EC being written or the different energy requirements for reading/writing data at different zones on a disk.

Adding redundancy introduces overhead that consumes more storage capacity or transmission bandwidth, which in turn adds cost and may increase energy consumption. The overhead added by erasure code processing tends to increase as the protection level provided increases. Ideally, the redundant information may never need to be accessed and thus conventional systems may group all redundancy together and store it in some out of the way place. This one-size-fits-all approach may produce sub-optimal results, particularly concerning energy conservation.

To enhance data protection, different approaches for storing redundant copies of items have been employed. Erasure codes are one such approach. An erasure code is a forward error correction (FEC) code for the binary erasure channel. The FEC facilitates transforming a message of k symbols into a longer message with n symbols so that the original message can be recovered from a subset of the n symbols, k and n being integers, n>k. The symbols may be individual items (e.g., characters, bytes) or groups of items. The original message may be, for example, a file. Optimal erasure codes have the property that any k out of the n code word symbols are sufficient to recover the original message.

Fountain codes are one type of EC. Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k.

An EC system may be described using an A/B notation, where B describes the total number of encoded symbols that can be produced for an input message and A describes the minimum number of the B encoded symbols that are required to recreate the message for which the encoded symbols were produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different locations. In the EC 10/16 example, the original message could be reconstructed from 10 verified fragments. Conventionally, the 16 encoded symbols have been treated equally, which may have produced sub-optimal results, particularly with respect to conserving energy.

Prior Art FIG. 1 illustrates an example set of systematic erasure codes. Prior Art FIG. 1 illustrates an original message 100 that has sixteen symbols S1, S2, . . . S16 (k=16) and that reads "original message". The symbols S1 . . . S16 may be referred to as the plaintext symbols for message 100. While the symbol size is one character, different symbol sizes may be employed. Message 100 is provided to erasure encoder 110. Erasure encoder 110 uses a generator matrix 120 to produce erasure codes 130. In this example, erasure encoder 110 produces erasure codes EC1, EC2, . . . ECn (n>k). The erasure codes include systematic erasure codes EC1 . . . EC16 (EC1 . . . ECk), which correspond directly to S1 . . . S16 (S1 . . . Sk). In this embodiment, at least EC1 . . . EC16 may be the same size as S1 . . . S16. For example, if the symbols S1 . . . S16 are one byte each, then the symbols EC1 . . . EC16 may also be one byte each. The erasure codes also include EC17 . . . ECn (ECk+1 . . . ECn), which do not correspond directly to any of S1 . . . Sk. In one embodiment, ECk+1 . . . ECn may be parity information. In another embodiment, ECk+1 . . . ECn may be other information that facilitates recreating the original message. In this embodiment, ECk+1 . . . ECn do not need to be the same size as S1 . . . S16. For example, if S1 . . . S16 are one byte, ECk+1 . . . ECn do not have to be one byte. While the systematic erasure codes are illustrated as being generated in order and in locations directly corresponding to the input message, in some embodiments, the systematic erasure codes may be distributed through the ECn codes and may be out of order.

The original message 100 can be recreated from any 16 of the systematic erasure codes EC1 . . . ECn. If EC1 . . . ECk are available, then original message 100 can be recreated without performing erasure code decoding. If any of EC1 . . . ECk are not available, then original message 100 can still be recreated but erasure code decoding would be necessary. Conventionally, all of the erasure codes EC1 . . . ECn may have been treated identically with respect to how they were stored. Conventionally, the generator matrix may have treated the generation of all the erasure codes EC1 . . . ECn identically. This may have produced sub-optimal results with respect to generating erasure codes, storing erasure codes, and recovering data using erasure codes.

Prior Art FIG. 2 illustrates an example set of non-systematic erasure codes. Prior Art FIG. 2 illustrates an original message 200 that also has sixteen symbols S1, S2, . . . S16 (k=16) and that reads "original message". While the symbol size is one character, different (e.g., larger) symbol sizes are likely to be employed. Message 200 is provided to erasure encoder 210. Erasure encoder 210 uses a generator matrix 220 to produce erasure codes 230. In this example, erasure encoder 210 produces non-systematic erasure codes EC1, EC2, . . . ECn (n>k). EC1, EC2, . . . ECn do not correspond directly to any of S1 . . . S16 as was the case for systematic erasure codes 130 (Prior Art FIG. 1). Instead, EC1, EC2, . . . ECn are the result of processing symbols S1 . . . S16 with the matrix 220 as controlled by erasure encoder 210. EC1, EC2, ... ECn do not have to be the same size as S1 ... S16. For example, S1 ... S16 may be one byte each that represent one ASCII character each while EC1, EC2, ... ECn are two bytes each. The different erasure codes EC1, EC2, ... ECn may be suitable for correcting different types of errors. For example, some erasure codes may be suitable or even optimal for correcting for single erasures, other erasure codes may be suitable or even optimal for correcting for two erasures, and yet other erasure codes may be suitable or even optimal for correcting for three or more erasures. Conventionally, the generator matrix 220 may have treated the generation of these erasure codes identically. Additionally, the erasure codes may have been stored without considering the suitability and thus efficiency of recovering data that is experiencing a certain type of erasure.

Prior Art FIG. 3 illustrates a conventional generator matrix 300. Typically, an erasure coder uses a generator matrix like matrix 300 for encoding data. An input message (e.g., plaintext) and the generator matrix 300 may be processed to produce erasure codes. For example, an input message and generator matrix 300 may be multiplied together using matrix multiplication to produce erasure codes. Conventionally, generator matrix 300 did not account for the different types of erasure codes that were produced by the generator matrix 300. For example, rows in the generator matrix 300 that yield systematic data and non-systematic data may have been placed without consideration of the suitability and thus efficiency of using the resulting erasure code to recover data that was suffering from different types of erasure conditions.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Prior Art

Prior Art

Prior Art

FIG. 4 illustrates a generator matrix for a systematic erasure code system where the upper sub-matrix is an identity matrix.

DETAILED DESCRIPTION

Figure 1:
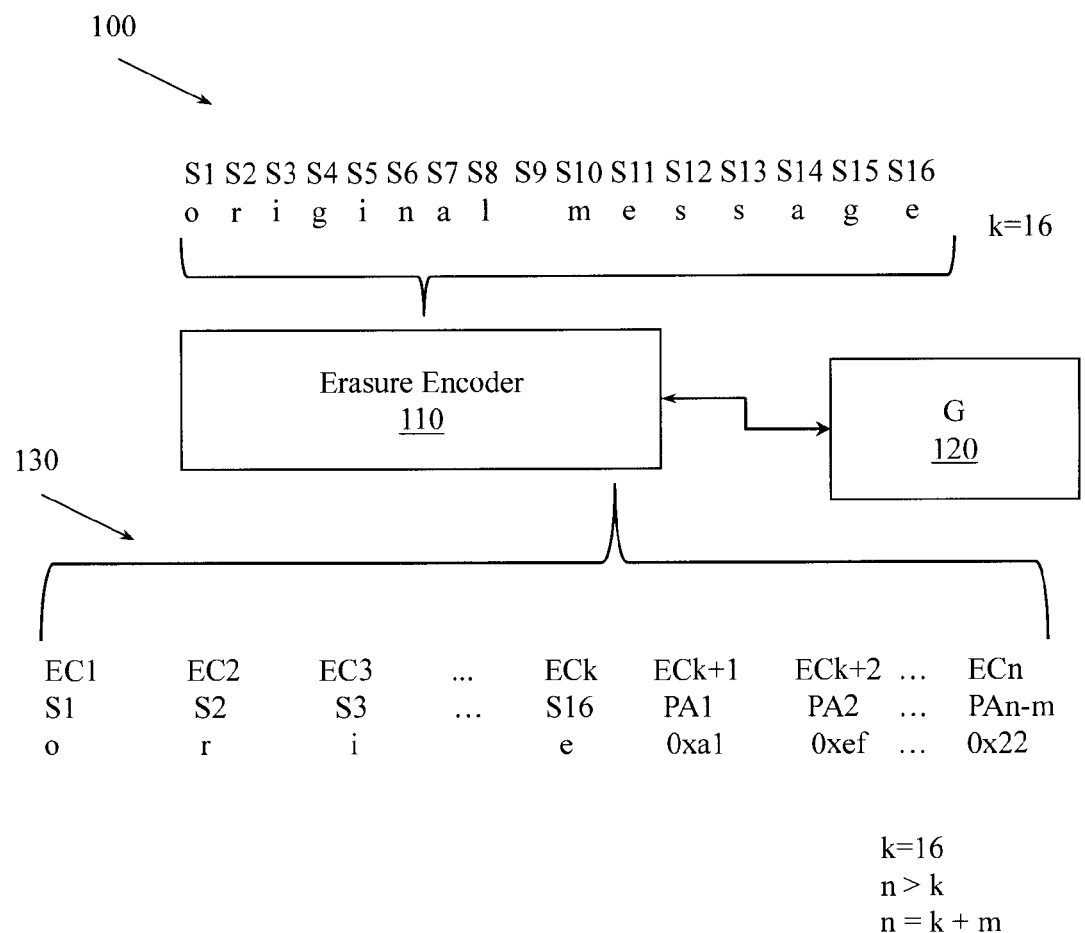
FIG. 1 illustrates an example set of systematic erasure codes.
Figure 2:
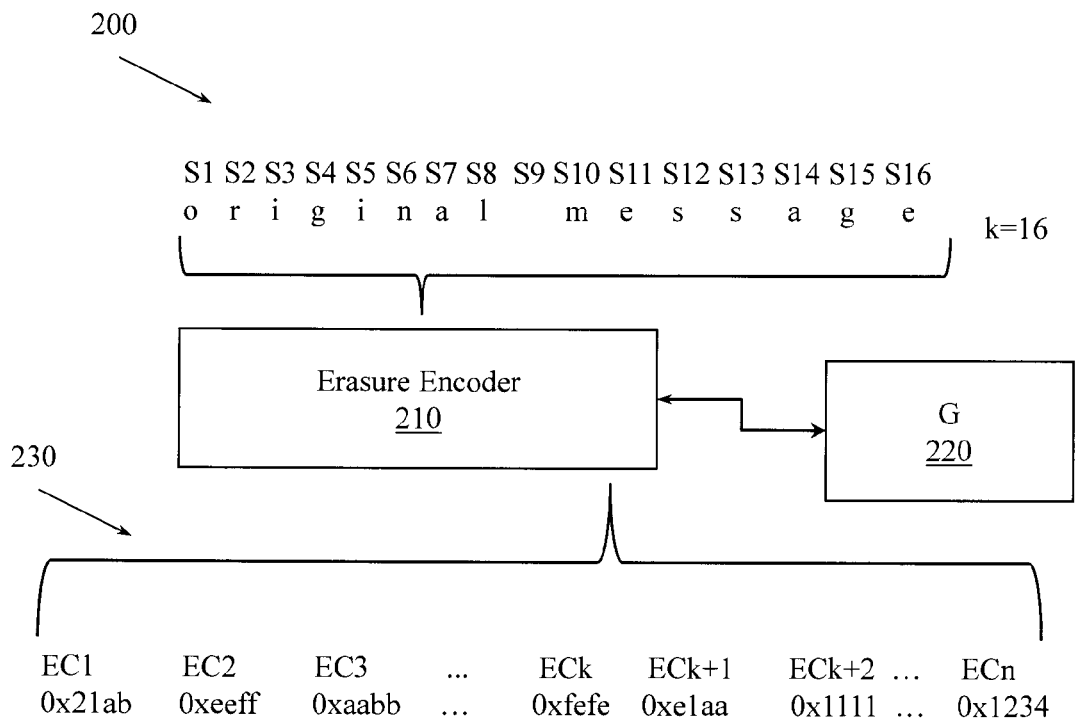
FIG. 2 illustrates an example set of non-systematic erasure codes.
Figure 3:
FIG. 3 illustrates a generator matrix.

Example apparatus and methods control generation, placement, or recovery of erasure codes. How codes are generated may be controlled, at least in part, by the suitability of the resulting code for a particular purpose. Where codes are placed (e.g., stored in memory, stored on disk, stored on tape) may also be controlled, at least in part, by metrics associated with the type of code. In one embodiment, which codes are retrieved may also be controlled, at least in part, by metrics associated with the type of code.

Example apparatus and methods employ an improved generator or generator matrix that introduces priority for different types of erasure codes. Codes that have a higher priority may be managed in a first way while codes that have a lower priority may be managed in a second way. The priority may be determined from metrics associated with the code. Metrics associated with code generation may include, for example, complexity to produce the code, complexity to recover an erasure using the code, whether the code can be used directly to recover an erasure, the type of erasure that the code is useful for recovering from, and other metrics. Metrics associated with code storage may include, for example, the dollar cost to store a code, the energy cost to store a code, the time to store a code, the dollar cost to retrieve a code, the energy cost to retrieve a code, the time to retrieve a code, and other metrics. The metrics associated with code storage may be manipulated by, for example, weights associated with the likelihood that a certain type of code will be needed to recover from a certain type of erasure. For example, an erasure that can be corrected with systematic data may be relatively easy to correct and thus the systematic data may have a relatively high priority. A single erasure that can be corrected using erasure codes that were produced using a single erasure equation (e.g., RAID-5) may have a relatively lower priority because correcting an error using this type of erasure code may be more complex. A "two-erasure" situation that can be corrected using erasure codes that were produced using a two erasure equation may have a still lower priority because correcting an error using this type of erasure code may be even more complex. In one embodiment, the equations and codes that are used to correct a two erasure situation may employ the equations or codes that were used to correct a single erasure situation. In this embodiment, the equations and codes that are used to correct the single erasure situation may have a higher priority than the equations and codes that are used to correct the two erasure situation.

Equations and codes that are used to correct a two erasure situation may be useful to correcting a three erasure situation. More generally, the equations and codes that may be useful to correcting an N erasure situation may include the equations and codes that are useful to correcting erasure situations from 1 to N−1, N being an integer. Thus, example apparatus and methods may manage processing and storage associated with the lower order (e.g., one erasure) recovery situations with a higher priority than the higher order (e.g., two erasures, three erasures, . . . N erasures).

Figure 4:
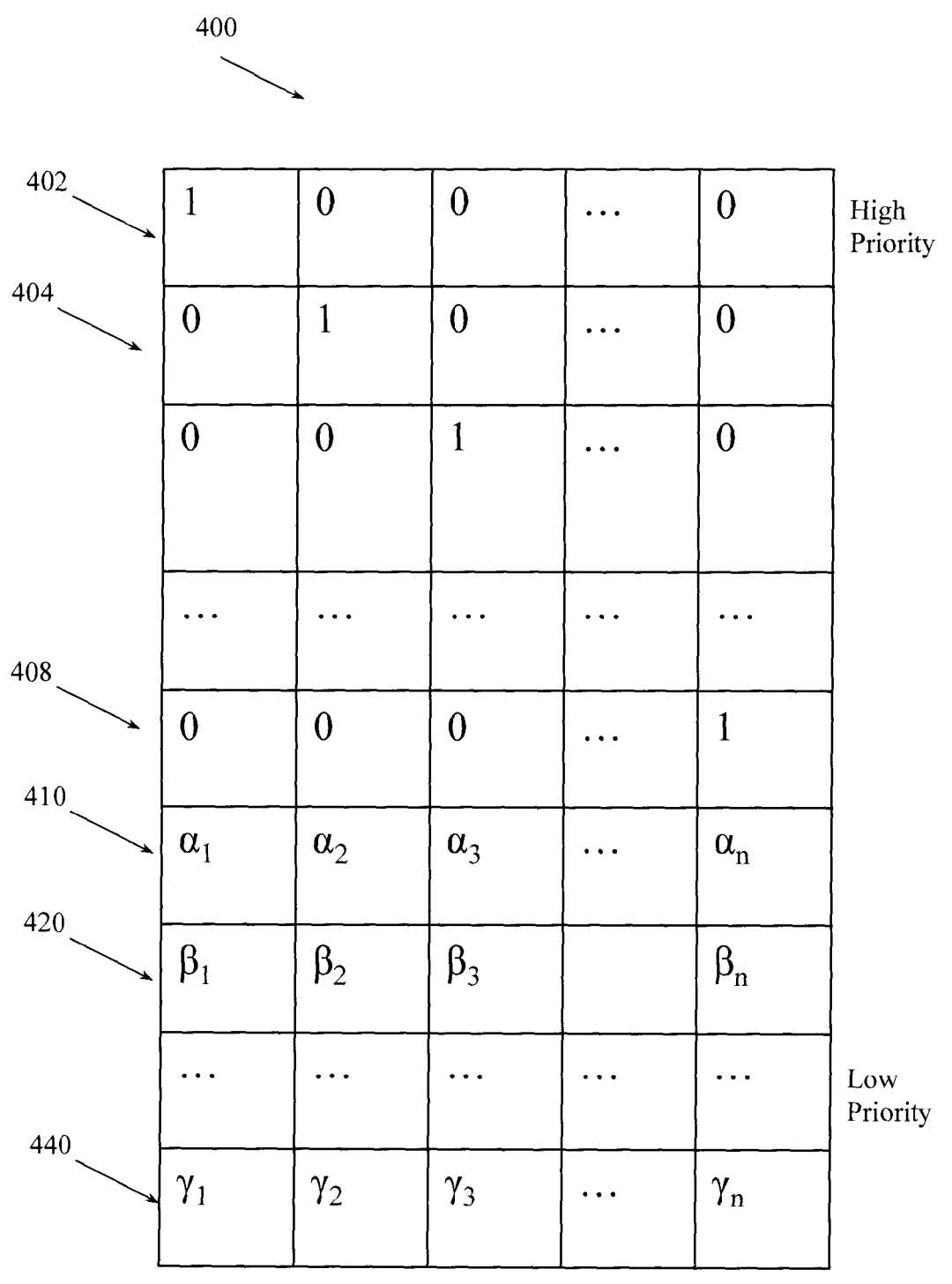

FIG. 4 illustrates an example generator matrix 400 that prioritizes erasure codes. Generator matrix 400 produces systematic erasure codes using an upper sub-matrix that is an identity matrix. Generator matrix 400 also produces non-systematic erasure codes using a lower sub-matrix that is not an identity matrix. The bottom of generator matrix 400 produces the erasure codes that have the lowest priority. For example, row 410 of generator matrix 400 may produce erasure codes useful for correcting a one erasure situation, row 420 of generator matrix 400 may produce erasure codes useful for correcting a two erasure situation, and so on down to the bottom row 440 of generator matrix 400 that may produce erasure codes useful for correcting a highest erasure situation. In one embodiment, the equations and erasure codes associated with row 410 may be useful to the equations and erasure codes associated with row 420. Similarly, the equations and erasure codes associated with rows 410 and 420 may be useful to the equations and erasure codes associated with row 440.

The erasure codes associated with row 440 may be the least likely to ever be used. The erasure codes associated with row 410 may be less likely to be used than the systematic data associated with any of rows 402 . . . 408. The erasure codes associated with row 420 may be less likely to be used than any of the codes associated with rows 402 . . . 410. Since erasure codes may have different likelihoods of ever being used, example apparatus and methods may manage how those codes are generated, stored, or retrieved differently. Managing the codes differently leads to improvements in, for example, storage cost, storage energy, retrieval time, bandwidth cost, and other factors.

Figure 5:
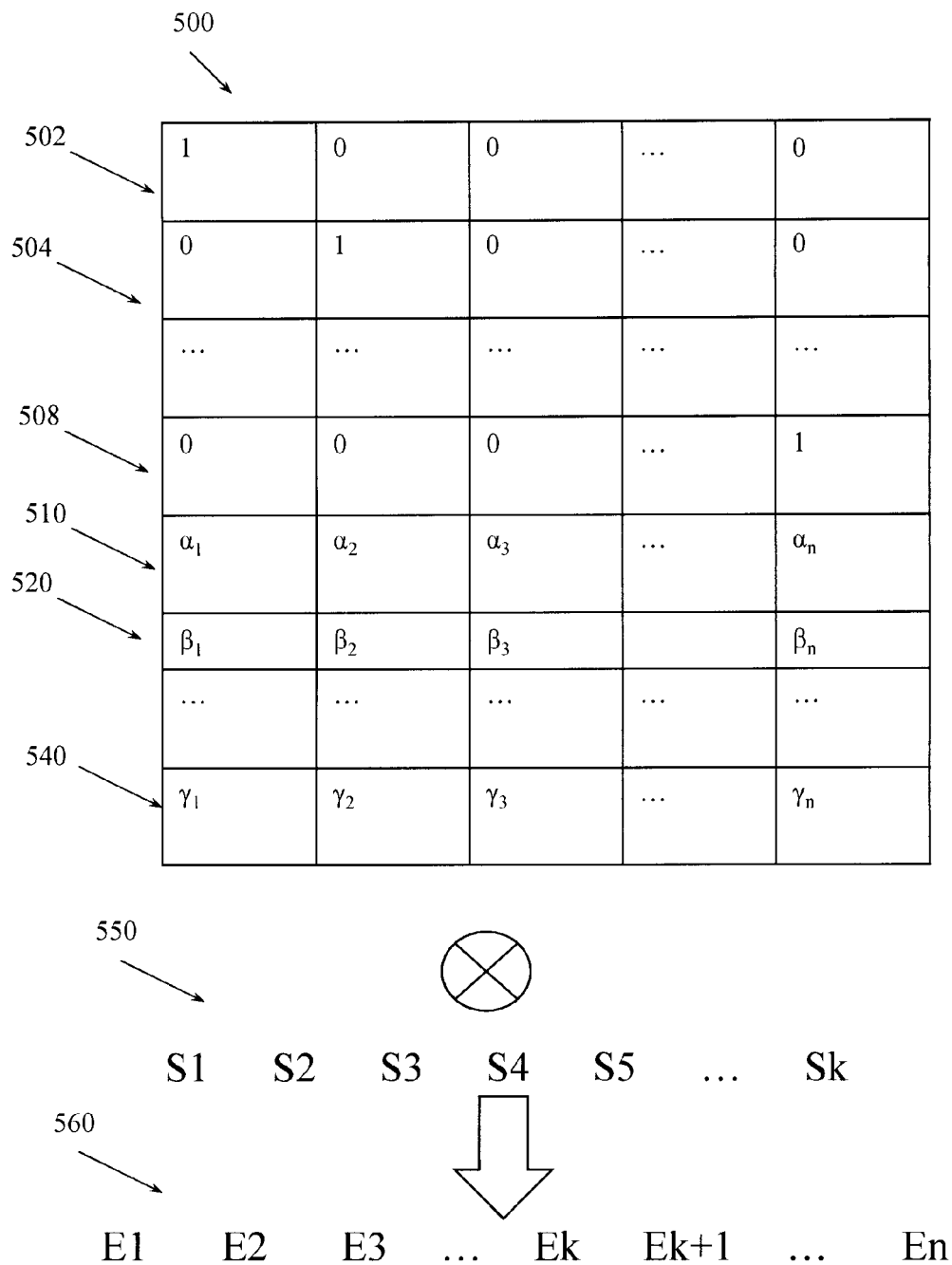
FIG. 5 illustrates example erasure code generation using a generator matrix and an input message.

FIG. 5 illustrates example erasure code generation using a generator matrix 500 and an input message 550. The input message 550 is multiplied by generator matrix 500 using matrix multiplication to produce erasure codes 560. A member of erasure codes 560 may be produced by multiplying message 550 by a single row of matrix 500. Unlike conventional approaches, message 550 may be multiplied by or otherwise processed using less than all of generator matrix 500. For example, the amount of matrix 500 that is used may be based on the type and amount of redundancy to be produced. In one example, the amount (e.g., number of rows) of matrix 500 that is used may be based on metrics associated with producing or storing the generated redundancy. The metrics may concern time, cost, power consumption, complexity, or other factors.

While the input message 550 had k symbols, the erasure codes 560 may have n symbols, where n>=k. In general, at least k symbols are required to decode the data. Decoding processes may vary by erasure code approach. For a systematic erasure code approach, if the erasure codes corresponding to the original input symbols are available, then no "decoding" is required, only re-assembly is required. For a single erasure where systematic data is not available, then some decoding may be required. Decoding for a single erasure may include using data produced by multiplying message 550 by row 510. Decoding for two erasures may include using data produced by multiplying message 550 by rows 510 and 520. Decoding for a higher number of erasures may include using data produced by multiplying message 550 by rows 510 through 540. The likelihood of needing data produced by multiplying message 550 by rows 510 through 540 may be very low. Thus, in one embodiment, message 550 may only be multiplied by a first subset of rows that start at row 502 and proceed down toward the bottom of generator matrix 500. In one embodiment, the depth of rows that are used may be selected based on the desired protection.

Conventional systems that do not prioritize systematic data over non-systematic data and that do not prioritize lower erasure data over higher erasure data do not perform this type of selective erasure code production. Instead, conventional systems multiply the input message 550 by all rows in the generator matrix 500 and produce all possible data, whether it is needed or not. Example apparatus and methods therefore improve the efficiency of a computer being controlled to produce erasure codes by allowing the production of just the desired data. Similarly, conventional systems may store all the data that is produced, whether it is needed or not. Example apparatus and methods reduce the amount of data to be stored and therefore improve the efficiency of a storage system. Conventional systems also store the complete set of erasure codes without considering the value of the data or the likelihood that the data will ever be used. Example apparatus and methods control where erasure codes are stored based, at least in part, on the likelihood that the data will be needed. Data that is most likely to be needed may be stored in a most energy efficient way because it might actually be used and thus the energy needed to use it might actually be consumed. Data that is less likely to be needed may be stored in a least energy efficient manner because it might never be used and thus the energy to use it might never be expended. Putting data that is going to be used in an energy efficient location (e.g., low energy outer zone of a disk) while putting data that is not going to be used in a less energy efficient location (e.g., high energy inner zone of a disk) improves the overall energy efficiency of a data storage system. Considering that data storage systems may include thousands of disks, the improvements in energy efficiency may be substantial.

While energy efficiency may be one metric that determines where and how data is stored, retrieval time and responsiveness (e.g., latency) may be another. In one embodiment, some systematic data may be stored in memory for the fastest possible retrieval. In this embodiment, the remaining systematic data may be stored on a highly responsive, powered-up disk for relatively slower but still fast retrieval. Similarly, non-systematic data useful for correcting a single erasure (e.g., RAID-5 data) may also be stored on a highly responsive, powered-up disk for fast retrieval. Data useful for correcting multiple erasures may be stored on other media that may not be as responsive.

Dollar cost may be another metric that controls where and how erasure codes are stored. For example, some systematic data may be stored in a most expensive location that provides superior retrieval results. The remaining systematic data and one erasure non-systematic data may be stored at a less expensive location that still provides good results. Higher order erasure non-systematic data may be stored at a least expensive location that provides the lowest quality results. Unlike conventional systems that may treat all erasure code data equally, example apparatus and methods prioritize the creation, storage, and retrieval of erasure codes. In one embodiment, only the redundancy that is necessary, essential, required, useful, or desired for an operation may be provided to the operation to reduce the amount of data processed.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
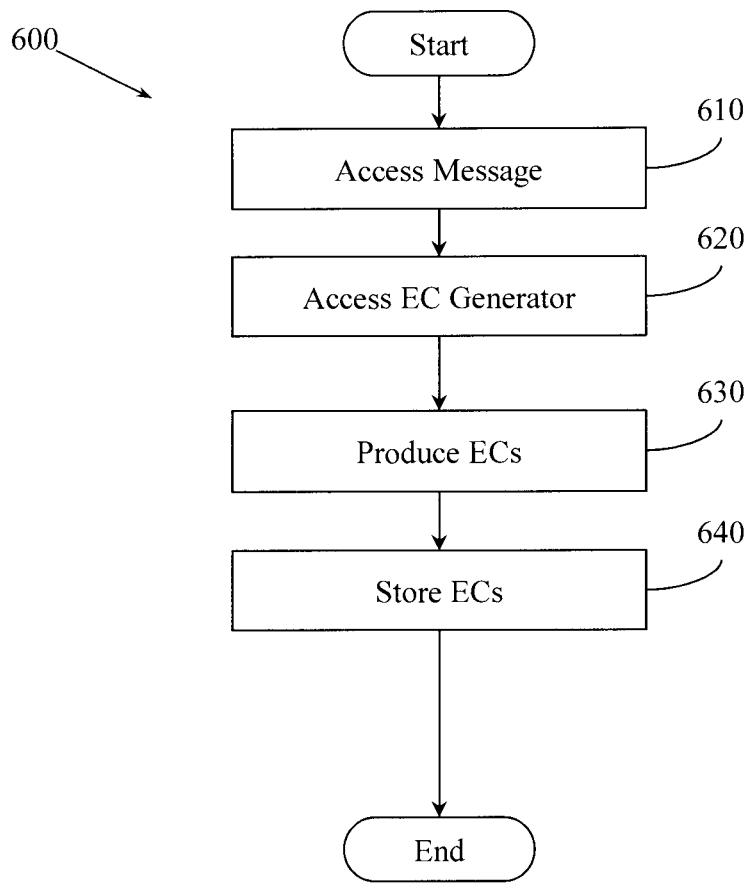
FIG. 6 illustrates an example method associated with erasure code prioritization.

FIG. 6 illustrates a method 600 associated with erasure code prioritization. Method 600 controls a data storage system (DSS) that uses erasure codes to provide redundancy for messages. Method 600 includes, at 610, accessing a message for which a non-empty set of erasure codes are to be produced.

Method 600 also includes, at 620, accessing an erasure code generator. Unlike a conventional erasure code generator that treats all EC the same, method 600 accesses an erasure code generator that has a first portion that produces a first type of EC having a first priority and that has a second portion that produces a second type of EC having a second different priority. While two portions are described, the erasure code generator may have two or more portions that produce different types of EC having different types of priorities.

In one embodiment, the EC generator uses a matrix of EC generating values. A row in the matrix has a priority ranking that reflects how important or how useful that type of EC may be. In one embodiment, producing the set of ECs for the message using the EC generator and the message includes multiplying the message by a number of rows in the matrix. The number of rows is controlled, at least in part, by the generation priority. A single EC may be produced by multiplying the message by a single row in the matrix.

In one embodiment, the priority ranking is user configurable. In another embodiment, the priority ranking is self-adapting over time. The priority ranking may adapt in response to performance data associated with the DSS. The performance data may include, for example, a number of errors experienced by the DSS, a type of error experienced by the DSS, a frequency of errors experienced by the DSS, a cost of power used by the DSS, a cost of network bandwidth used by the DSS, or other information.

In one embodiment, a priority ranking for a row associated with a systematic EC is higher than a priority ranking for a row associated with a non-systematic EC. In one embodiment, a priority ranking for a row associated with a non-systematic EC varies inversely with the number of erasures for which the non-systematic EC corrects. Thus, a non-systematic EC that corrects for a single erasure may have a higher priority than a non-systematic EC that corrects for two erasures.

The priorities may change over time. In one embodiment, the priorities may change in response to user configuration. In another embodiment, the priorities may self-adapt over time. The priorities may self-adapt based, at least in part, on performance data associated with the DSS. The performance data may describe a number of errors experienced by the DSS, a type of error experienced by the DSS, a frequency of errors experienced by the DSS, a cost of power used by the DSS, a cost of network bandwidth used by the DSS, or other information.

Method 600 also includes, at 630, selectively producing the set of ECs for the message using the EC generator and the message. Unlike conventional systems where the set of ECs would be identical under most or even all conditions, method 600 produces a set of ECs where the membership of the set and the order of ECs in the set depend, at least in part, on a generation priority. The generation priority facilitates producing an appropriate number and type of ECs as controlled by user configurable parameters or conditions existing in a DSS.

The generation priority may consider a number of factors. For example, the generation priority may be a function of a complexity to compute a type of EC, a cost to compute a type of EC, a time to compute a type of EC, an amount of energy used to compute a type of EC, a depth of redundancy desired for the message, or a usefulness of a type of EC. The usefulness of a type of EC may be measured by a number or type of erasures that the EC can fix. For example, a non-systematic EC that can correct for a single erasure may also be useful for correcting two erasure situations, three erasure situations, and other multiple erasure situations. However, an EC that can correct for a two erasure situation may not be useful for a single erasure situation.

Method 600 also includes, at 640, selectively storing a member of the set in a data storage device (DSD) in the DSS. Once again, unlike conventional systems that store all the ECs without regard to priorities, the member and the DSD may be selected based, at least in part, on a storage priority. In one embodiment, the storage priority is a function of one or more factors. The factors may include, for example, a cost to store an EC on a DSD, a time to store an EC on a DSD, an amount of energy used to store an EC on a DSD, or a network bandwidth required to store an EC on a DSD. Considering the time required to store an EC may improve the computing efficiency of the DSD. Considering the amount of energy required to store an EC may improve the energy efficiency of the DSD. Considering the bandwidth required to store an EC may reduce the network or data communication resources for the DSD.

Consider a situation where the DSD is a disk that includes a platter that rotates. A spinning platter may have high energy use zones (e.g., rings closer to the center of the platter) and lower energy use zones (e.g., rings near the outer edge of the platter). Thus, method 600 may control the disk to position data on the platter based on a likelihood that the data will be used and the energy efficiency. For example, placement may be controlled so that the distance to the data relative to the outer edge of the platter varies inversely with the likelihood that the data will be used.

Figure 7:
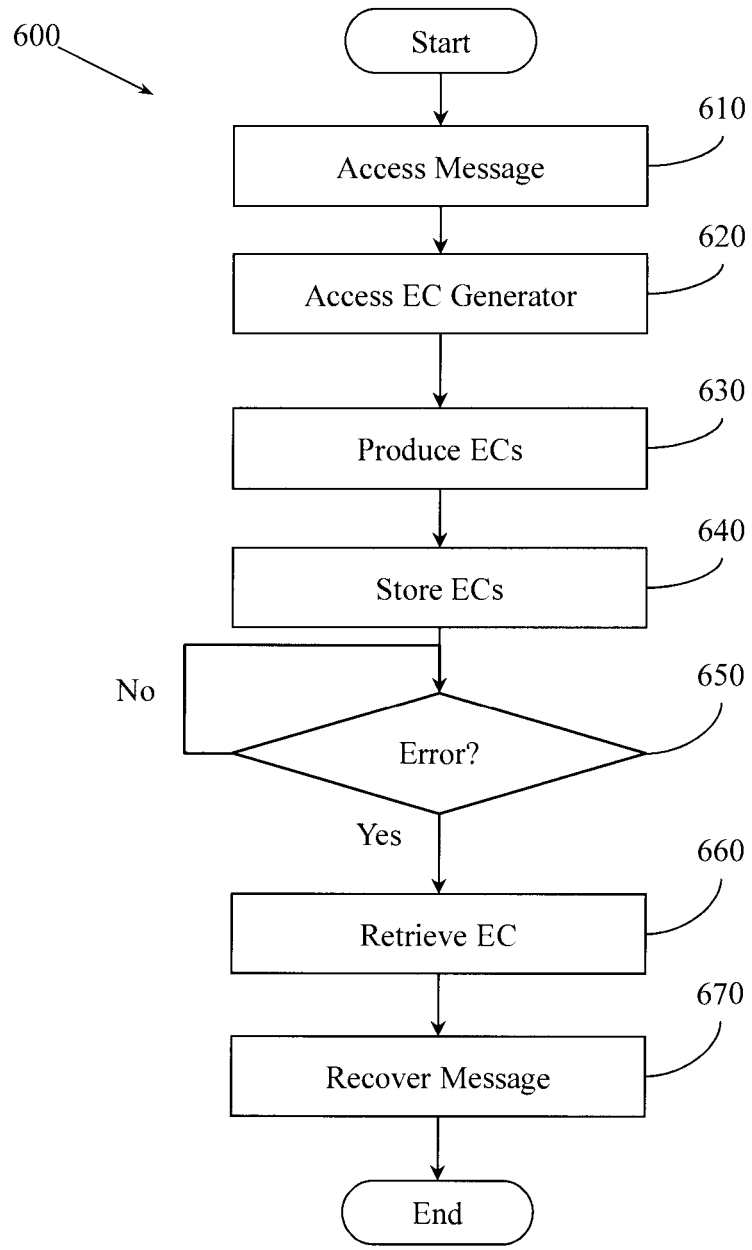
FIG. 7 illustrates an example method associated with erasure code prioritization.

FIG. 7 illustrates another embodiment of 600. This embodiment also includes, at 650, determining that an erasure error associated with the message has occurred. Upon determining that an erasure has occurred, method 600 may, at 660, retrieve a selected EC from a device in the DSD. The selected member may be chosen based, at least in part, on a retrieval priority. In one embodiment, the retrieval priority is a function of one or more factors. The factors may include, for example, a cost to retrieve an EC from a DSD, a time to retrieve an EC from a DSD, an amount of energy used to retrieve an EC from a DSD, or a network bandwidth required to retrieve an EC from a DSD. Considering the time required to retrieve an EC may improve the computing efficiency of the DSD. Considering the amount of energy required to retrieve an EC may improve the energy efficiency of the DSD. Considering the bandwidth required to retrieve an EC may reduce the network or data communication resources for the DSD.

This embodiment of method 600 also includes, at 670, recovering the message using the selected EC. Recovering a message using EC is understood by one skilled in the art.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Object", as used herein, refers to the usage of object in computer science. From one point of view, an object may be considered to be a location in a physical memory having a value and referenced by an identifier.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
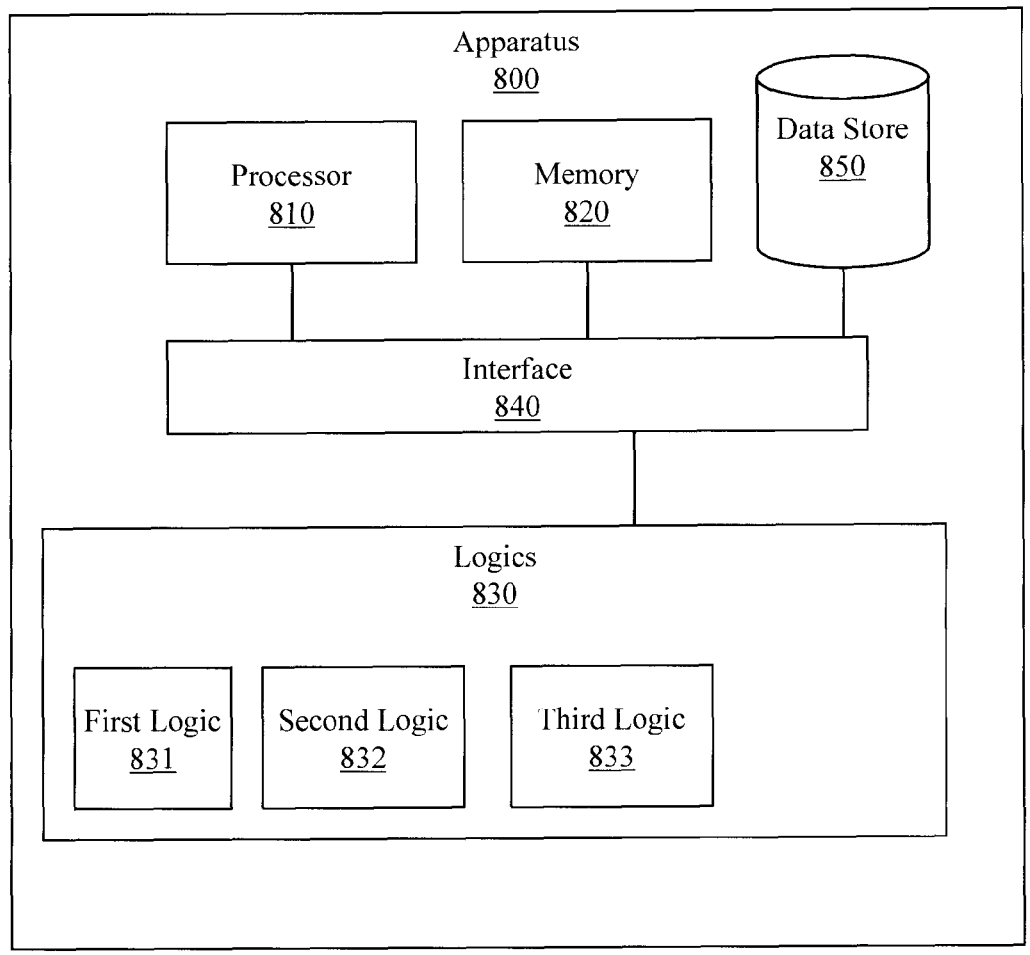
FIG. 8 illustrates an example apparatus associated with erasure code prioritization.

FIG. 8 illustrates an apparatus 800 that includes a processor 810, a memory 820, a data store 850, and a set 830 of logics that is connected to the processor 810, memory 820, and data store 850 by an interface 840. In one embodiment, the apparatus 800 may be a stand-alone device connected to a data communication network. In another embodiment, apparatus 800 may be integrated into another device (e.g., deduplication apparatus) or system (e.g., object storage system). The data store 850 stores a set of erasure codes associated with a message. The erasure codes may be, for example, systematic erasure codes, non-systematic erasure codes, fountain codes, rateless erasure codes, or other erasure codes. In one embodiment, the set of erasure codes stored in data store 850 is sufficient to reconstruct the message. While data store 850 is illustrated inside apparatus 800, in different embodiments data store 850 may be a standalone apparatus or a co-operating collection of apparatus.

The memory 820 stores electronic data that manages erasure codes for messages in a data storage system (DSS) that protects messages using erasure codes.

The set 830 of logics may include a first logic 831 that produces an EC for a message present in the DSS. Unlike conventional systems where all ECs are created equal, first logic 831 handles different ECs differently based, at least in part, on a priority. The priority may control an order in which ECs are produced. The priority may also control the amount of ECs produced. Thus, in one embodiment, the first logic 831 determines a number of ECs to be generated for the message and determines an order in which the ECs will be generated. The number and the order are based, at least in part, on the priority. In one embodiment, the order prioritizes production of systematic ECs ahead of production of non-systematic ECs. In one embodiment, the order prioritizes production of ECs associated with correcting X erasures ahead of ECs associated with correcting Y erasures, X and Y being numbers, X being less than Y. Producing ECs according to a priority facilitates improving computing efficiency and reducing power requirements for a computer and data storage system.

The apparatus 800 may also include a second logic 832 that stores the EC. Unlike conventional systems that may store all EC using sequential writes that do not differentiate between different types of EC, second logic 832 may select a location to store the EC in the DSS based, at least in part, on the priority. For example, an EC that has the highest priority may be stored in a most accessible location that has the lowest latency while an EC that has a lower priority may be stored in a less accessible location that may have a higher latency.

In one embodiment, an EC has an associated likelihood of use. Additionally, locations in the DSS have energy efficiency ratings. When likelihood information and energy efficiency information is available, the second logic 832 may select the location to store an EC based on a relationship between the likelihood of use and the energy efficiency rating. For example, ECs may be stored to optimize a utility measure that combines likelihood of use and energy efficiency. In another embodiment, locations in the DSS have latency ratings. When likelihood information and latency information is available, the second logic 832 may select the location to store an EC based on a relationship between the likelihood of use and the latency rating. For example, ECs may be stored to optimize a utility measure that combines likelihood of use and latency ratings. In one embodiment, a combined utility measure may be optimized. The combined utility measure may consider likelihood of use, latency, and energy efficiency.

The apparatus 800 may also include a third logic 833 that retrieves an EC from the DSS and recovers the message using the EC. Unlike conventional systems that may blindly retrieve EC, third logic 833 controls the retrieval based, at least in part, on the priority. For example, an EC that has a higher priority may be retrieved before an EC that has a lower priority. This may reduce the amount of time required to acquire appropriate EC for recovering a message. This may also reduce the amount of power required to acquire appropriate EC for recovering a message.

Figure 9:
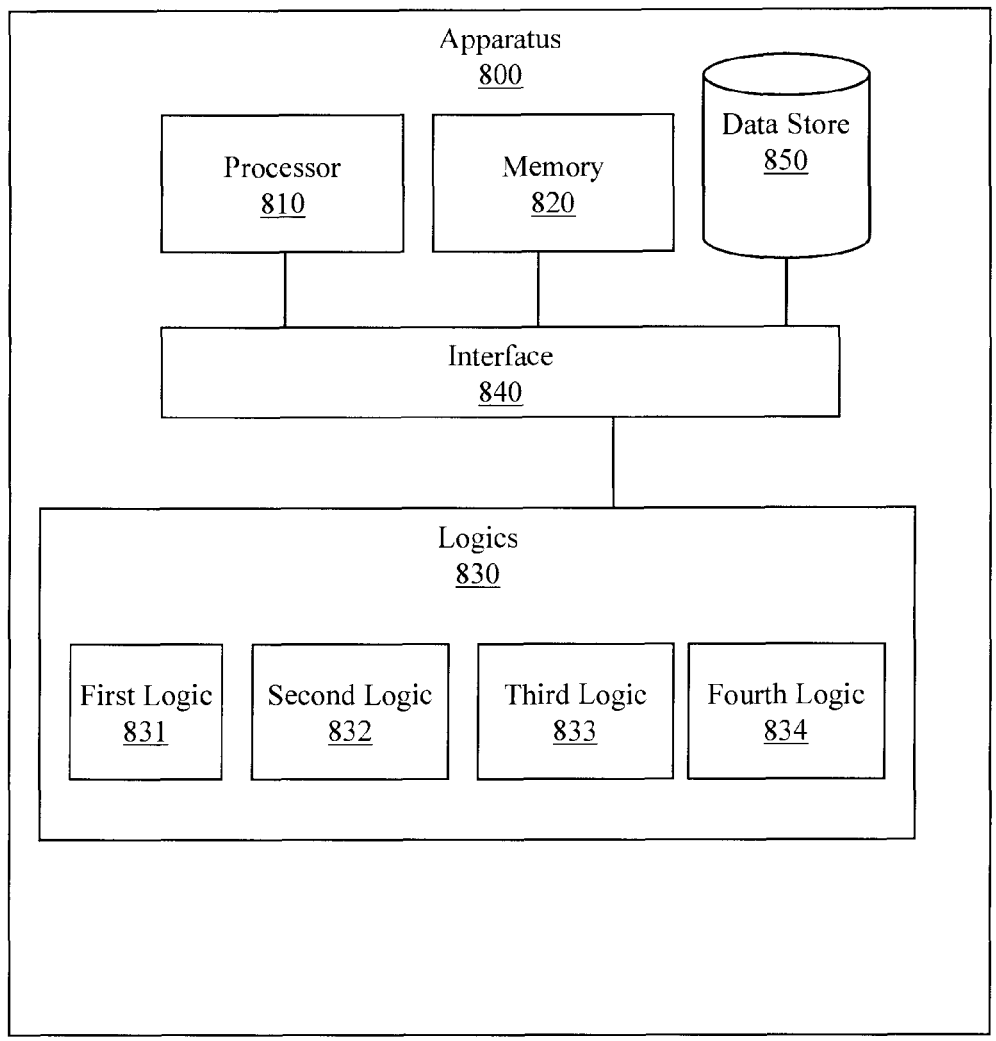
FIG. 9 illustrates an example apparatus associated with erasure code prioritization.

FIG. 9 illustrates another embodiment of apparatus 800. This embodiment includes a fourth logic 834. The fourth logic 834 identifies a condition in the DSS and manipulates the priority based, at least in part, on the condition. The condition may be, for example, an erasure code A/B policy, A and B being numbers, a number of errors experienced by the DSS, a type of error experienced by the DSS, a frequency of errors experienced by the DSS, an amount of power required to store an EC in the DSS, an amount of power required to retrieve an EC from the DSS, a network bandwidth required to store an EC in the DSS, or a network bandwidth required to retrieve an EC from the DSS. In one embodiment, the priority is self-adapting based, at least in part, on the condition. For example, as the condition changes over time the priority may be adapted in response to the changing condition. For example, over time, the number and type of errors experienced by a DSS may change. Thus, a first type of EC that was most appropriate for the original number and type of errors and that therefore had a highest priority may be deprioritized and a second type of EC that is most appropriate for the current number and type of errors may be prioritized.

Figure 10:
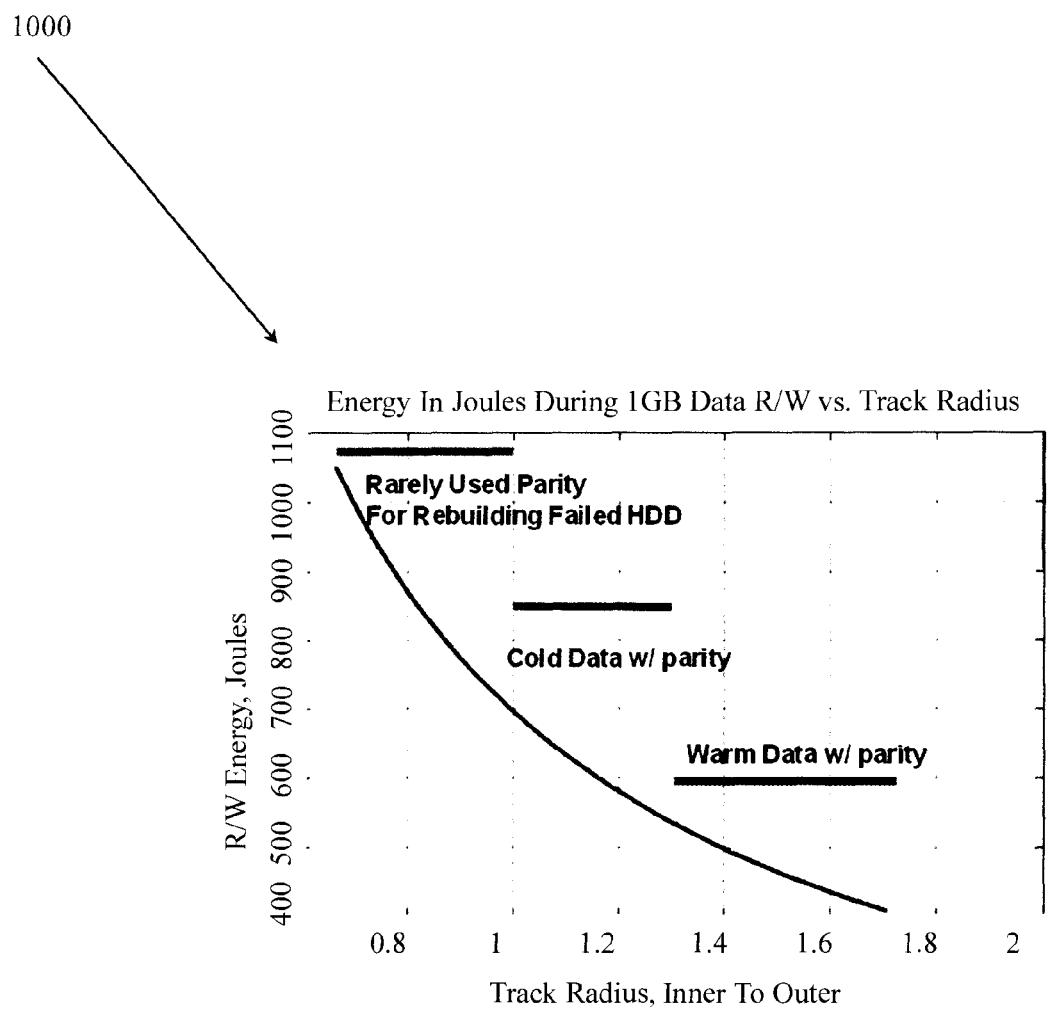
FIG. 10 illustrates disk platter energy zones.

FIG. 10 illustrates a relationship between where data is stored on a disk and how much energy it takes to access that data. Spinning disk platters may have different zones that use different amounts of energy to read and write data. The energy usage is related to spinning the disk and to read/write head movement. Other data storage devices may also have different energy zones. In one embodiment, data may be placed at a location on a spinning disk platter based on a relationship between the likelihood that the data will be used and the energy efficiency of the location. For example, data that is most likely to be used may be stored at a location that is most energy efficient while data that is less likely to be used may be stored at a location that is less energy efficient.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage medium storing computer executable instructions that when executed by a computer control the computer to perform a method for controlling a data storage system (DSS) that uses erasure codes to provide redundancy for messages, the method comprising:
   accessing a message for which a non-empty set of erasure codes are to be produced;
   accessing an erasure code generator, where a first portion of the erasure code generator produces a first type of erasure code (EC) having a first priority, and where a second portion of the EC generator produces a second type of EC having a second different priority;
   selectively producing the set of ECs for the message using the EC generator and the message, where the membership of the set and the order of ECs in the set depend, at least in part, on a generation priority, and
   selectively storing a member of the set in a data storage device (DSD) in the DSS, where the member and the DSD are selected based, at least in part, on a storage priority.

2. The non-transitory computer-readable storage medium of claim 1, comprising:
   in response to detecting an erasure error associated with the message, retrieving a selected EC from a device in the DSD, where the selected member is selected based, at least in part, on a retrieval priority, and
   recovering the message using the selected EC.

3. The non-transitory computer-readable storage medium of claim 2, where the retrieval priority is a function of a cost to retrieve an EC from a DSD, a time to retrieve an EC from a DSD, an amount of energy used to retrieve an EC from a DSD, or a network bandwidth required to retrieve an EC from a DSD.

4. The non-transitory computer-readable storage medium of claim 1, where the EC generator uses a matrix of EC generating values, where a row in the matrix has a priority ranking, and where producing the set of ECs for the message using the EC generator and the message includes multiplying the message by a number of rows in the matrix, where the number is controlled, at least in part, by the generation priority.

5. The non-transitory computer-readable storage medium of claim 4, where the priority ranking is user configurable, or
where the priority ranking is self-adapting over time in response to performance data associated with the DSS, where the performance data includes a number of errors experienced by the DSS, a type of error experienced by the DSS, a frequency of errors experienced by the DSS, a cost of power used by the DSS, or a cost of network bandwidth used by the DSS.

6. The non-transitory computer-readable storage medium of claim 4, where a priority ranking for a row associated with a systematic EC is higher than a priority ranking for a row associated with a non-systematic EC.

7. The non-transitory computer-readable storage medium of claim 6, where a priority ranking for a row associated with a non-systematic EC varies inversely with the number of erasures for which the non-systematic EC corrects.

8. The non-transitory computer-readable storage medium of claim 1, where the generation priority is a function of a complexity to compute a type of EC, a cost to compute a type of EC, a time to compute a type of EC, an amount of energy used to compute a type of EC, a depth of redundancy desired for the message, or a usefulness of a type of EC.

9. The non-transitory computer-readable storage medium of claim 1, where the storage priority is a function of a cost to store an EC on a DSD, a time to store an EC on a DSD, an amount of energy used to store an EC on a DSD, or a network bandwidth required to store an EC on a DSD.

10. The non-transitory computer-readable storage medium of claim 1, where the generation priority, the storage priority, or the retrieval priority are user configurable, or are self-adapting over time based, at least in part, on performance data associated with the DSS, where the performance data includes a number of errors experienced by the DSS, a type of error experienced by the DSS, a frequency of errors experienced by the DSS, a cost of power used by the DSS, or a cost of network bandwidth used by the DSS.

11. The non-transitory computer-readable storage medium of claim 1, where the DSD is a disk that includes a platter that rotates, and where the method includes controlling the disk to position data on the platter based on a likelihood that the data will be used, where the distance to the data relative to the outer edge of the platter varies inversely with the likelihood that the data will be used.

* * * * *